(12) United States Patent
Kuramochi et al.

(10) Patent No.: US 7,696,918 B2
(45) Date of Patent: Apr. 13, 2010

(54) A-D CONVERT APPARATUS

(75) Inventors: Yasuhide Kuramochi, Tokyo (JP);
Akira Matsuzawa, Tokyo (JP)

(73) Assignees: Tokyo Institute of Technology (JP);
Advantest Corporation (JP)

( * ) Notice: Subject to any disclaimer, the term of this patent is extended or adjusted under 35 U.S.C. 154(b) by 0 days.

(21) Appl. No.: 12/176,420

(22) Filed: Jul. 21, 2008

(65) Prior Publication Data

US 2010/0013690 A1    Jan. 21, 2010

(51) Int. Cl.
*H03M 1/38* (2006.01)
(52) U.S. Cl. .................................. 341/161; 341/155
(58) Field of Classification Search ................ 341/155, 341/138, 118, 120, 159, 161
See application file for complete search history.

(56) References Cited

U.S. PATENT DOCUMENTS

| | | | | |
|---|---|---|---|---|
| 5,920,274 | A * | 7/1999 | Gowda et al. | 341/155 |
| 6,747,588 | B1 * | 6/2004 | Huang et al. | 341/156 |
| 2003/0034910 | A1 * | 2/2003 | Schmid | 341/161 |
| 2005/0122247 | A1 * | 6/2005 | Hammerschmidt et al. | 341/163 |

FOREIGN PATENT DOCUMENTS

| JP | 7170185 | 7/1995 |
|---|---|---|
| JP | 09135170 | 5/1997 |
| JP | 2000295106 | 10/2000 |
| JP | 2005086550 | 3/2005 |

OTHER PUBLICATIONS

Shuo-Wei Mike Chen, Robert W. Brodersen, "A 6b 600MS/s 5.3mW Asynchronous ADC in 0.13μm CMOS", ISSCC 2006 Digest of Technical Papers, Feb. 8, 2006, p. 574-575,p. 674.
"Search Report of PCT counterpart application", issued on Jul. 21, 2009, p. 1-p. 3.

* cited by examiner

*Primary Examiner*—Brian Young
(74) *Attorney, Agent, or Firm*—Chen Yoshimura LLP

(57) ABSTRACT

Provided is a successive approximation AD conversion apparatus that outputs digital output data corresponding to an analog input signal, including a bit selecting section that selects a conversion target bit sequentially from a highest bit of the output data; a data control section that outputs comparison data determining a value of the conversion target bit, each time a conversion target bit is selected; a DA conversing section that outputs an analog comparison signal corresponding to the comparison data; a comparing section that outputs a comparison result between the input signal and the comparison signal, upon the output of the comparison signal by the DA converting section, and that is reset after outputting the comparison result; a completion detecting section that, upon detecting that the comparing section has output the comparison result, outputs a completion signal causing the bit selecting section to select a next conversion target bit, prior to the comparing section being reset; and an output section that outputs output data in which a value of each bit is based on the comparison result by the comparing section.

9 Claims, 13 Drawing Sheets

A-D CONVERT APPARATUS

BACKGROUND

1. Technical Field

The present invention relates to an AD conversion apparatus. In particular, the present invention relates to an asynchronous successive approximation AD conversion apparatus.

2. Related Art

An asynchronous successive approximation AD conversion apparatus is known as in, for example, Japanese Patent Application Publication No. 7-170185 (referred to hereinafter as "Patent Document 1") and Shuo-Wei Mike Chen, Robert W. Brodersen, "A 6b 600 MS/s 5.3 mW Asynchronous ADC in 0.13 μm CMOS", ISSCC 2006 DIGEST OF TECHNICAL PAPERS, Feb. 8, 2006, p. 574-575, p. 674 (referred to hereinafter as "Non-patent Document 1"). The asynchronous successive approximation AD conversion apparatus changes each bit without synchronizing the changing with a clock.

The asynchronous successive approximation AD conversion apparatus is provided with a completion detecting section that detects whether the comparison performed by the comparator is finished. The asynchronous successive approximation AD conversion apparatus moves on to the processing of the next bit cycle when the completion detecting section detects that the comparator has finished the comparison.

The asynchronous successive approximation AD conversion apparatus in Patent Document 1 is provided with an exclusive NOR gate and two inverter gates having different inverted potentials supplied by the potential difference between an input signal and a comparison signal, as described with reference to paragraph "0013" for example. The exclusive NOR gate outputs a comparison completion signal indicating that the comparison has been finished, when the output values of the two inverter gates are equal to each other.

The AD conversion apparatus disclosed in Non-patent Document 1 is provided with a comparator performing the differentiation operation, e.g. FIG. 31.5.3, and a NAND gate, e.g. the third paragraph of Non-patent Document 1. The NAND gate generates a ready signal indicating initiation of the subsequent bit cycle (paragraph 4) when the differential output signals Qn, Qp of the comparator shown in FIG. 31.5.3 are connected to the positive potential, in other words, when the reset is performed.

The AD conversion apparatus disclosed in Patent Document 1, however, must be provided with two specialized impedance gates serving as potential threshold values for the two different inverted potentials, such as a potential that is ¾ of the power supply potential and a potential that is ¼ of the power supply potential, and therefore the circuit size becomes undesirably large. Furthermore, since the AD conversion apparatus disclosed in Non-patent Document 1 must suspend processing from when the comparator outputs the conversion result to when the reset is preformed, the conversion time becomes undesirably long.

Cited documents:
Japanese Patent Application Publication No. 7-170185
Shuo-Wei Mike Chen, Robert W. Brodersen, "A 6b 600 MS/s 5.3 mW Asynchronous ADC in 0.13 μm CMOS", ISSCC 2006 DIGEST OF TECHNICAL PAPERS, Feb. 8, 2006, p. 574-575, p. 674

SUMMARY

Therefore, it is an object of an aspect of the innovations herein to provide an AD conversion apparatus, which is capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary AD conversion apparatus may include a successive approximation AD conversion apparatus that outputs digital output data corresponding to an analog input signal, including a bit selecting section that selects a conversion target bit sequentially from a highest bit of the output data; a data control section that outputs comparison data determining a value of the conversion target bit, each time a conversion target bit is selected; a DA converting section that outputs an analog comparison signal corresponding to the comparison data; a comparing section that outputs a comparison result between the input signal and the comparison signal, upon the output of the comparison signal by the DA converting section, and that is reset after outputting the comparison result; a completion detecting section that, upon detecting that the comparing section has output the comparison result, outputs a completion signal causing the bit selecting section to select a next conversion target bit, prior to the comparing section being reset; and an output section that outputs output data in which a value of each bit is based on the comparison result by the comparing section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
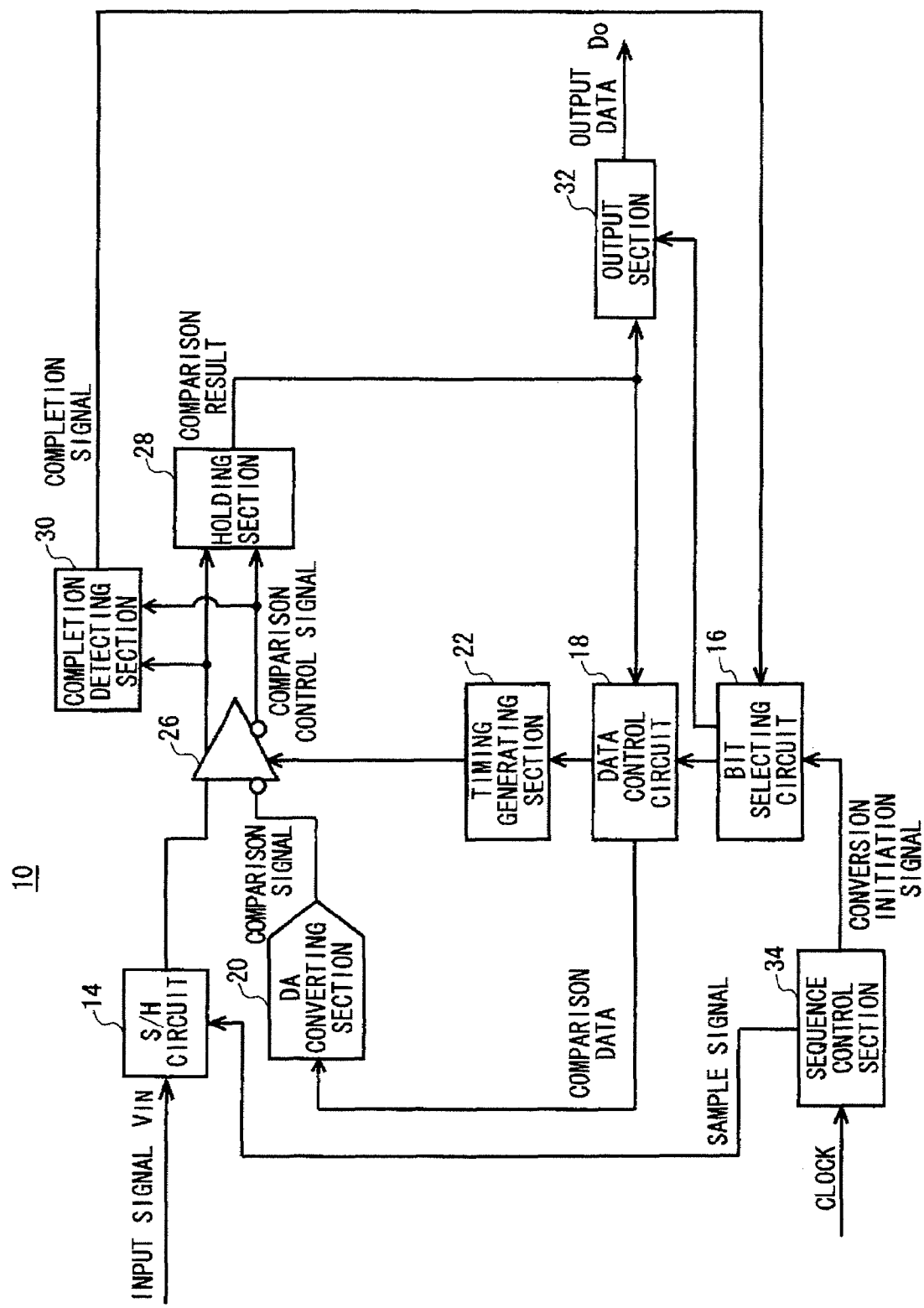
FIG. 1 shows a configuration of the AD conversion apparatus 10 according to an embodiment of the present invention.

FIG. 1 shows a configuration of the AD conversion apparatus 10 according to an embodiment of the present invention. The AD conversion apparatus 10 is an asynchronous successive approximation analog-to-digital conversion apparatus that outputs digital data in response to an analog input signal. The AD conversion apparatus 10 of the present embodiment converts a voltage value $V_{IN}$ of the analog input signal into digital output data $D_O$ having N-bits, where N is an integer greater than one.

The AD conversion apparatus 10 is provided with an S/H circuit 14, a bit selecting section 16, a data control section 18, a DA converting section 20, a timing generating section 22, a comparing section 26, a holding section 28, a completion detecting section 30, an output section 32, and a sequence control section 34. The S/H circuit 14 samples the input signal. The S/H circuit 14 holds the sampled analog input signal.

The bit selecting section 16 selects conversion target bits in sequence from the top bit in the output data, upon receiving a conversion initiation signal or a completion signal. For example, the bit selecting section 16 sequentially selects conversion target bits one at a time from the most significant bit in the output data, which is the N-th bit, to the least significant bit, which is the first bit.

The data control section 18 generates comparison data for determining the value of each conversion target bit selected by the bit selecting section 16. In other words, the data control section 18 outputs comparison data indicating a comparison signal for determining whether each conversion target bit of the output data has a value of 0 or 1. The data control section 18 outputs the generated comparison data to the DA converting section 20. The method used to generate the comparison data is described in detail in FIG. 6.

The DA converting section 20 outputs an analog comparison signal corresponding to the comparison data from the data control section 18. More specifically, the DA converting section 20 DA converts each piece of comparison data received from the data control section 18. The DA converting section 20 may be a capacitor array DA converter.

The timing generating section 22 outputs a comparison control signal ordering comparison initiation, after a prescribed delay time has passed from when the DA converting section 20 receives the comparison data. The timing generating section 22 outputs a comparison control signal ordering a reset, after a prescribed delay time has passed from when the comparison initiation is ordered. For example, the timing generating section 22 generates the comparison control signal as a pulse in which a leading edge, e.g. a rising edge, indicates the comparison initiation and a trailing edge, e.g. a falling edge, indicates the reset. The timing generating section 22 supplies the comparing section 26 with the comparison control signal.

The comparing section 26 initiates comparison between the input signal and the comparison signal at a timing of the comparison initiation indicated by the comparison control signal. For example, if the leading edge of the comparison control signal, e.g. the rising edge, indicates the comparison initiation, the comparing section 26 initiates the comparison at the timing of the leading edge of the comparison control signal. The comparing section 26 outputs a comparison result obtained by comparing the input signal and the comparison signal from when the comparison is initiated. The comparing section 26 causes a delay from when the comparison is initiated to when the comparison result is output. The delay time from when the comparing section 26 initiates the comparison to when the comparing section 26 outputs the comparison result is referred to as the "response time" hereinafter.

The comparing section 26 may output, as the comparison result, a logic value indicating whether the input signal is greater than the comparison signal. For example, the comparing section 26 outputs a value of one when the input signal is greater than the comparison signal and outputs a value of zero when the input signal is less than or equal to the comparison signal.

The comparing section 26 resets the comparison result at a timing of the reset indicated by the comparison control signal. For example, if a trailing edge, e.g. a falling edge, of the comparison control signal indicates the reset, the comparing section 26 initiates the reset at the timing of the trailing edge of the comparison control signal. The comparing section 26 may output a predetermined logic value such as one or zero in response to the comparison result being reset. Hereinafter, the period from when the comparing section 26 is supplied with the order to initiate the comparison to when the comparing section 26 is reset is referred to as the "comparison period," and the period from when the comparing section 26 is reset to when the comparing section 26 is supplied with the next order to initiate the comparison is referred to as the "reset period."

This comparing section 26 outputs the comparison result of the input signal and the comparison signal when the DA converting section 20 has output the comparison signal, and is then reset. The comparing section 26 of the present embodiment outputs a differential comparison result. In other words, during the comparison period, the comparing section 26 outputs a negative result signal and a positive result signal that represent differential logic values of the comparison result. During the reset period, the comparing section 26 outputs a negative result signal and a positive result signal that each represent a logic value fixed at one of the values.

The holding section 28 acquires the comparison result when the comparing section 26 outputs the comparison result, and holds the acquired comparison result. Even if the comparison result of the comparing section 26 is reset, the holding section 28 continues to hold the acquired comparison result until the comparing section 26 outputs the next new comparison result. The holding section 28 of the present embodiment holds a differential comparison result. In addition, the holding section 28 may hold one of the comparison results from the differential comparison result, such as the positive comparison result.

After the comparing section 26 has output the comparison result, the completion detecting section 30 outputs a completion signal to the bit selecting section 16 that causes the bit selecting section 16 to select the next conversion target bit. The completion detecting section 30 of the present embodiment outputs the completion signal prior to resetting the comparing section 26, upon detecting that the comparing section 26 has output the comparison result. For example, the completion detecting section 30 outputs the completion signal at a timing at which the logic value of the positive result signal from the comparing section 26 is not equal to the logic value of the negative result signal from the comparing section 26. This completion detecting section 30 can move the conversion target bit selected by the bit selecting section 16 one bit lower than its current position.

The output section 32 determines the value of each bit of the output data based on the comparison results output by the comparing section 26. For example, when a conversion target bit is selected, the output section 32 determines a value of one for a bit having a comparison result indicating that the input signal is greater than the comparison signal, and determines a value of zero for a bit having a comparison result indicating that the input signal is less than or equal to the comparison signal. The output section 32 outputs the output data to the outside after determining the values of all the bits in the output data. The output section 32 continues outputting this data until the next output data is determined.

The sequence control section 34 controls the overall operation of the AD conversion apparatus 10. The sequence control section 34 receives a clock representing the sampling cycle from the outside. Upon receiving the clock, the sequence control section 34 generates a sample signal designating the hold period and the sample period, and provides this sample signal to the S/H circuit 14. Furthermore, upon receiving the clock, the sequence control section 34 generates the conversion initiation signal and provides this signal to the bit selecting section 16.

Figure 2:
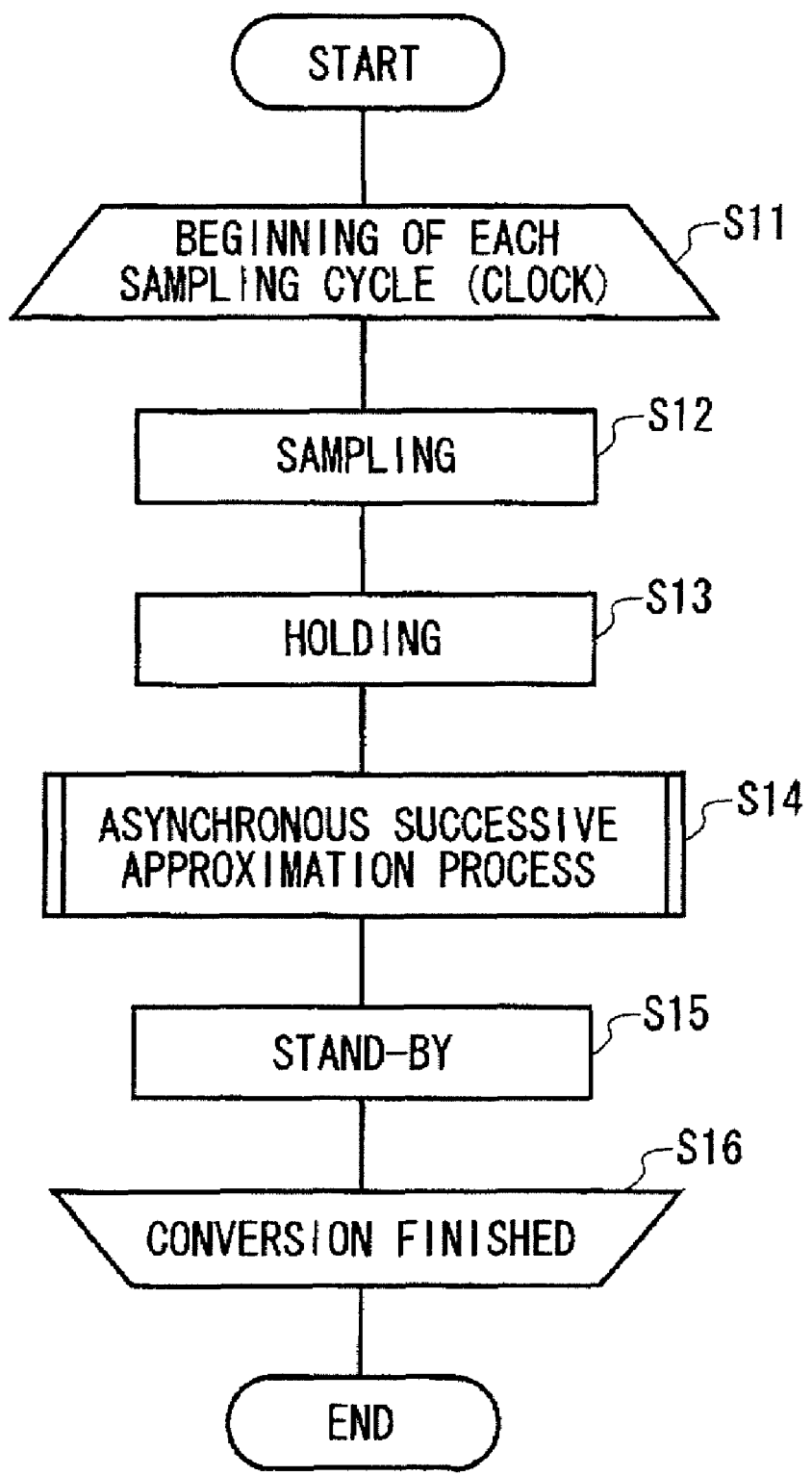
FIG. 2 shows the process flow of the sequence control section 34.

FIG. 2 shows the process flow of the sequence control section 34. The sequence control section 34 performs steps S12 to S15 in each sampling cycle, which corresponds to each time the clock is supplied (S11, S16).

First, the sequence control section 34 causes the S/H circuit 14 to sample the input signal in each sampling cycle (S12). When sampling of the input signal is completed, the sequence control section 34 causes the S/H circuit 14 to hold the sampled input signal (S13). The sequence control section 34 causes the S/H circuit 14 to continue to hold the input signal.

The sequence control section 34 supplies the bit selecting section 16 with the conversion initiation signal to cause the bit selecting section 16 or the like to perform the asynchronous successive approximation process (S14). A detailed process flow of the asynchronous successive approximation process is described in FIG. 4.

As a result of the asynchronous successive approximation process performed by the bit selecting section 16 or the like, the sequence control section 34 can output the output data corresponding to the input signal from the output section 32. The sequence control section 34 suspends operation of the AD conversion apparatus 10 until the next sampling cycle begins (S15). By doing this, the sequence control section 34 can limit the power consumed by the AD conversion apparatus 10.

Figure 3:
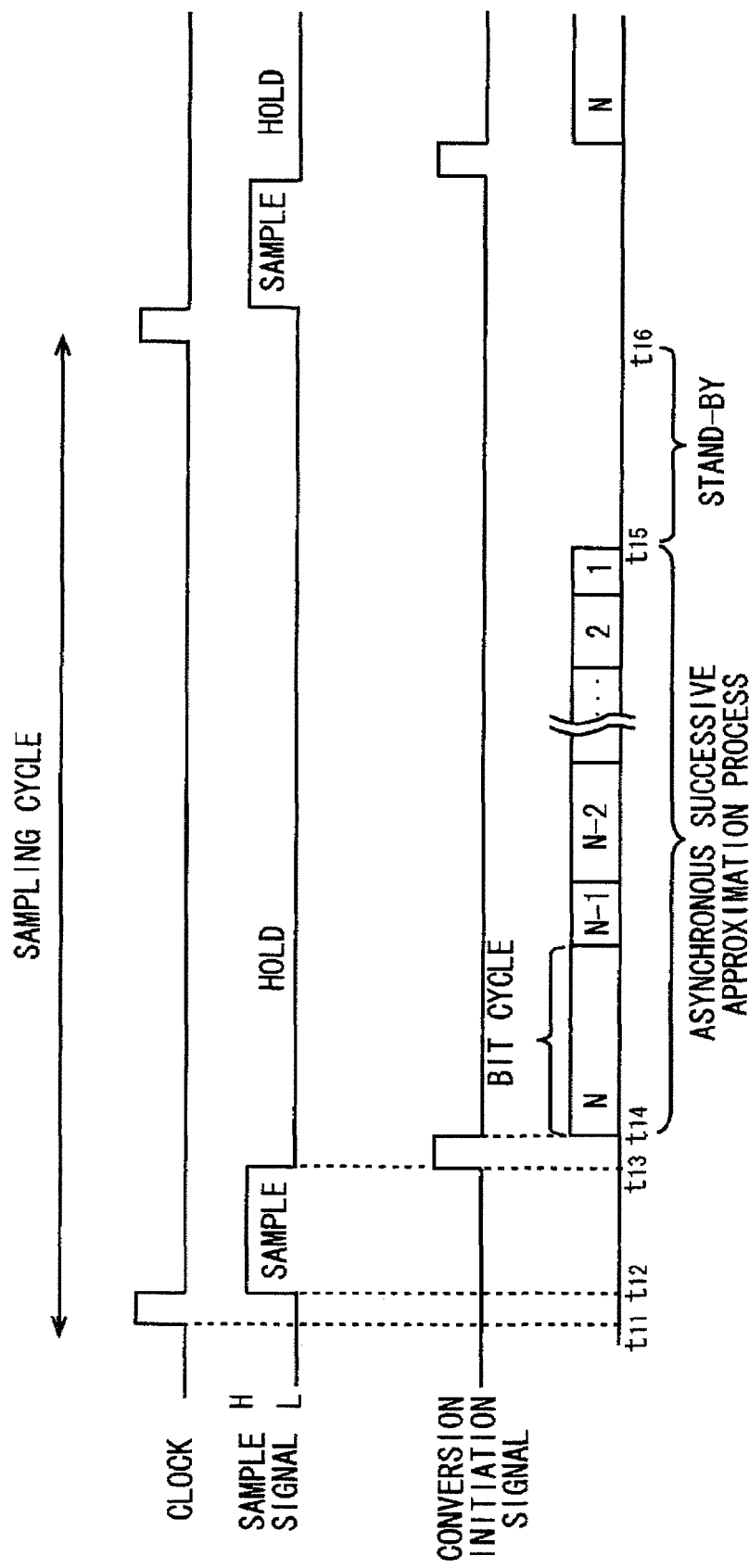
FIG. 3 is a timing chart showing an example of signals in the AD conversion apparatus 10.

FIG. 3 is a timing chart showing an example of signals in the AD conversion apparatus 10. The sequence control section 34 is provided with the clock for each sampling cycle (times t11, t16). A sampling cycle may be a fixed period or may be a period that changes as appropriate.

Upon receiving the clock, the sequence control section 34 sets the sample signal to logic H, for example, to begin the sampling with the S/H circuit 14 (time t12). The S/H circuit 14 samples the input signal while the sample signal is logic H, for example (times t12 to t13).

When a prescribed period has passed since the sample signal was set to logic H, the sequence control section 34 sets the sample signal to logic L, for example, so that the S/H circuit 14 begins the holding process (time t13). The S/H circuit 14 holds the sampled input signal while the sample signal is logic L, for example (times t13 to t16).

After the S/H circuit 14 begins the holding process, the sequence control section 34 provides the bit selecting section 16 with the conversion initiation signal (time t13). The bit selecting section 16 or the like performs the asynchronous successive approximation process upon receiving the conversion initiation signal (times t14 to t15). When the asynchronous successive approximation process ends (time t15), the sequence control section 34 suspends operation of the AD conversion apparatus 10 until the next clock is provided (times t15 to t16).

Figure 4:
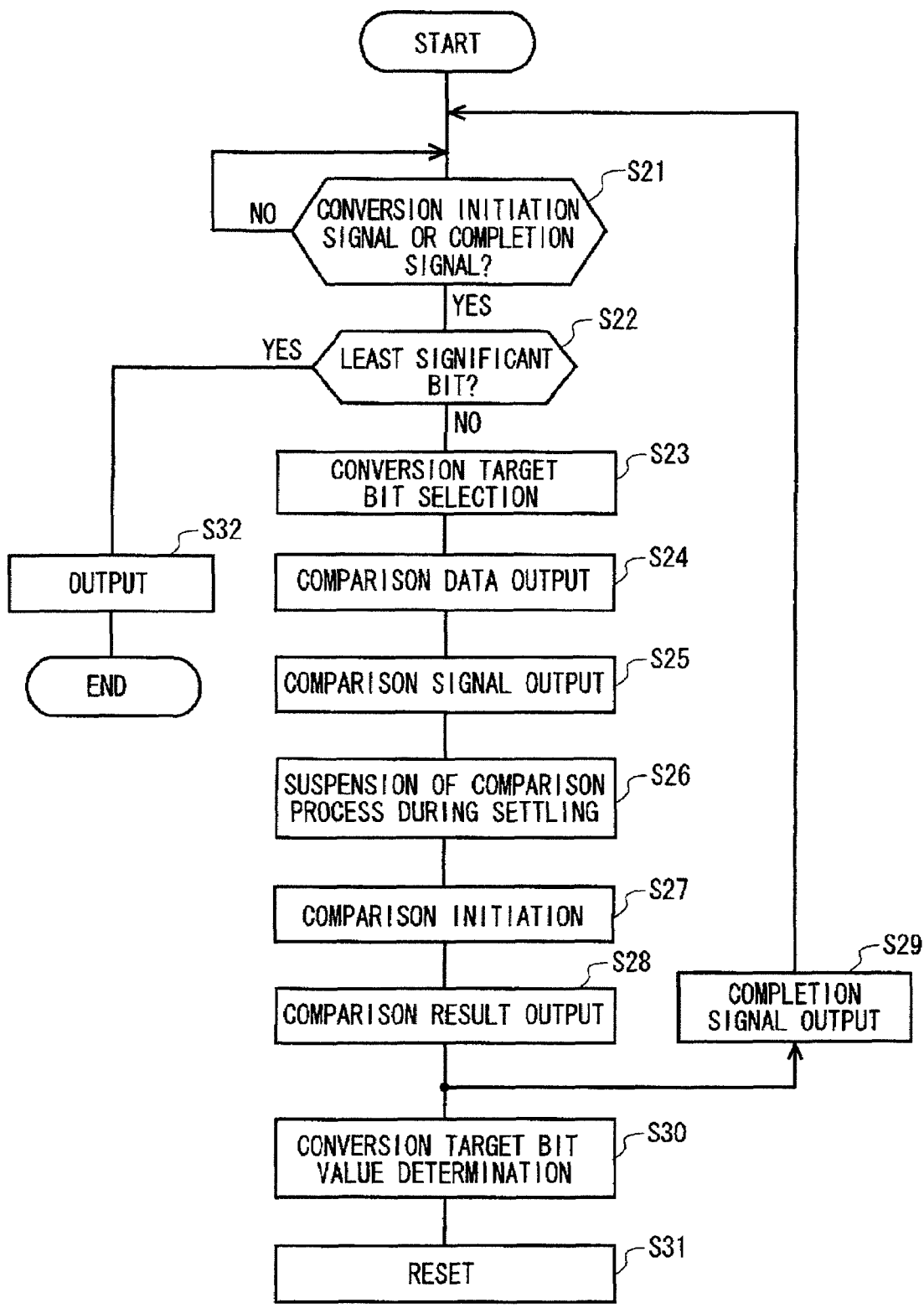
FIG. 4 shows the process flow occurring during the asynchronous successive approximation process by the AD conversion apparatus 10, which is step S14 of FIG. 2.

FIG. 4 shows the process flow occurring during the asynchronous successive approximation process by the AD conversion apparatus 10, which is step S14 of FIG. 2. First, upon receiving the conversion initiation signal or the completion signal (the "Yes" of S21), the bit selecting section 16 judges whether the currently selected conversion target bit is the least significant bit (S22).

If the currently selected conversion target bit is not the least significant bit (the "No" of S22), the bit selecting section 16 selects a new conversion target bit from among the bits of the output data (S23). More specifically, if the conversion initiation signal is received, the bit selecting section 16 selects the most significant bit of the output data as the conversion target bit. If the completion signal is received, the bit selecting section 16 selects a bit that is one bit lower than the current conversion target bit as a new conversion target bit.

After the bit selecting section 16 selects the new conversion target bit, the data control section 18 generates comparison data for determining the value of the selected conversion target bit, and outputs this comparison data to the DA converting section 20 (S24). The method for generating the comparison data is described in detail in FIG. 6.

Upon receiving the comparison data, the DA converting section 20 outputs the comparison signal corresponding to the comparison data (S25). The comparing section 26 suspends the comparison process from when the DA converting section 20 receives the comparison data to when the comparison signal output by the DA converting section 20 stabilizes (S26). After this settling time has passed, the comparing section 26 begins comparing the input signal to the comparison-signal (S27).

The comparing section 26 outputs the comparison result between the input signal and the comparison signal (S28). When the comparing section 26 has output the comparison result, the output section 32 determines the value of the conversion target bit of the output data (S30). For example, the output section 32 determines the value of the conversion target bit to be one when the output comparison result indicates that the input signal is greater than the comparison signal, and determines the value of the conversion target bit to be zero when the output comparison result indicates that the input signal is less than or equal to the comparison signal. After the prescribed comparison time has passed since the initiation of the comparison process, the comparing section 26 is reset (S31).

Upon detecting that the comparing section 26 has output the comparison result, the completion detecting section 30 outputs the completion signal prior to the comparing section 26 being reset (S29). For example, the completion detecting section 30 detects that the comparing section 26 has output the comparison result by detecting a timing at which the logic value of the positive result signal from the comparing section 26 is not equal to the logic value of the negative result signal from the comparing section 26. Since the comparing section 26 can receive the completion signal prior to being reset in this way (S21), the bit selecting section 16 can more quickly begin processing of the next bit.

When the bit selecting section 16 has selected all of the bits from the most significant bit to the least significant bit of the output data (the "Yes" of S22), the bit selecting section 16 notifies the output section 32 that processing of all bits has been finished, causing the process to move to step S32. Upon receiving notification from the bit selecting section 16 that processing of all the bits has been finished, the output section 32 outputs the values of all the bits of the output data to the outside (S32). After the output section 32 outputs this data, the asynchronous successive approximation process ends.

Figure 5:
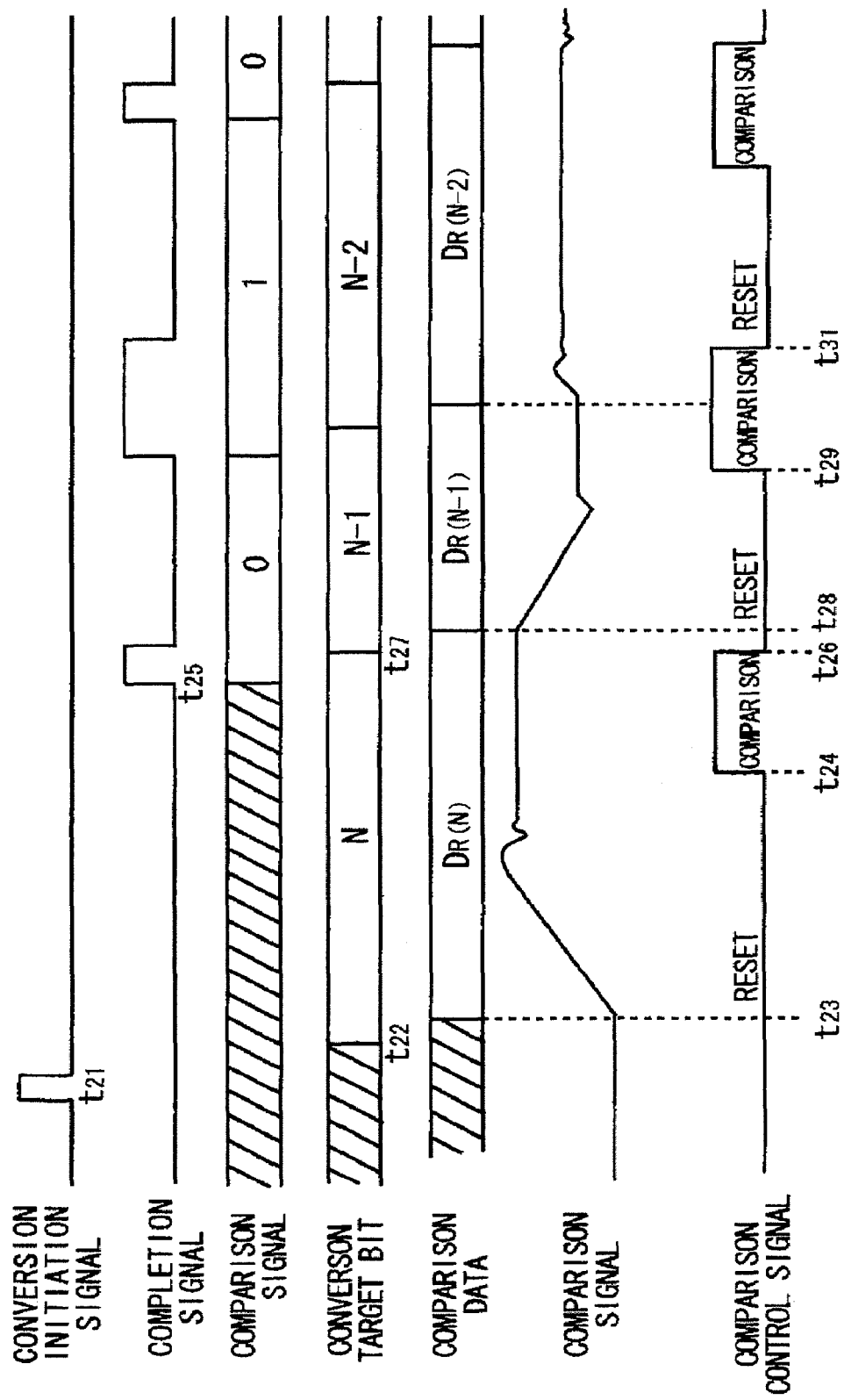
FIG. 5 is a timing chart showing an example of signals in the AD conversion apparatus 10 during the asynchronous successive approximation process of the AD conversion apparatus 10, which is step S14 in FIG. 2.

FIG. 5 is a timing chart showing an example of signals in the AD conversion apparatus 10 during the asynchronous successive approximation process of the AD conversion apparatus 10, which is step S14 in FIG. 2. First, when the conversion initiation signal has been output (time t21), the bit selecting section 16 selects the most significant bit, which is the N-th bit, as the conversion target bit (time t22).

The data control section 18 outputs the comparison data for determining the value of the conversion target bit to the DA converting section 20 (time t23). The DA converting section 20 outputs the comparison signal upon receiving the comparison data.

The comparing section 26 receives the comparison initiation order after the comparison signal has settled (time t24) and then begins the comparison between the input signal and the comparison signal. After the response time has passed since receiving the comparison initiation order, the comparing section 26 outputs the comparison result (time t25). After a prescribed time has passed since receiving the comparison initiation order, the comparing section 26 is reset (time t26).

The response time of the comparing section 26, which is the time from when the comparison initiation order is received to when the comparison result is output, becomes longer as the difference between the input signal and the comparison signal supplied to the comparing section 26 becomes smaller. Accordingly, the timing generating section 22 controls the generation timing of the comparison control signal such that the period from when the comparing section 26 begins the comparison operation to when the comparing section 26 is reset, namely the comparison period, becomes relatively long in comparison to the slowest response time of the comparing section 26. In this way, the timing generating section 22 can be sure to reset the comparing section 26 after the comparing section 26 has output the comparison result, even if the difference between the input signal and the comparison signal is very small.

Upon detecting that the comparing section 26 has output the comparison result, the completion detecting section 30 outputs the completion signal prior to the comparing section 26 being reset (time t25). When the completion signal has been output, the bit selecting section 16 selects a new conversion target bit (time t27). The AD conversion apparatus 10 repeats the same processes from the time t22 to the time t27.

Since the completion detecting section 30 in the AD conversion apparatus 10 outputs the completion signal prior to the performing the reset, as described above, the bit selecting section 16 can more quickly begin processing the next bit. Accordingly, the conversion period can be shortened by using this AD conversion apparatus 10.

Figure 6:
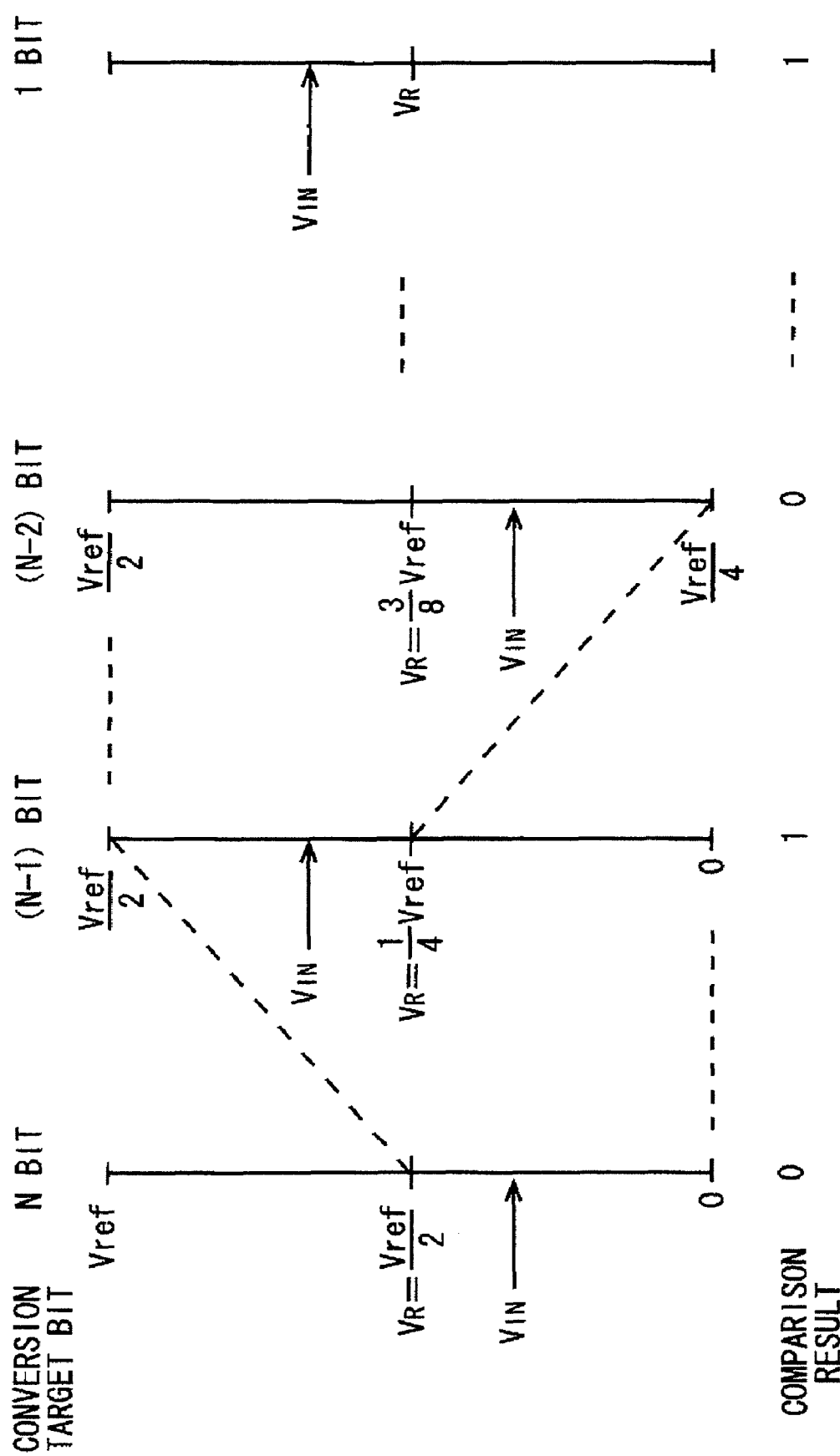
FIG. 6 shows an exemplary process performed by the data control section 18 to generate the comparison data.

FIG. 6 shows an exemplary process performed by the data control section 18 to generate the comparison data. In the present embodiment, the input signal range of the AD conversion apparatus 10 is between zero and Vref, inclusive.

The data control section 18 outputs comparison data for determining the value of each conversion target bit selected by the bit selecting section 16. More specifically, the data control section 18 outputs comparison data representing a boundary between (i) the output data in which the selected conversion target bit is equal to zero and the bits higher than the conversion target bit are equal to a value based on the comparison result and (ii) the output data in which the selected conversion target bit is equal to one and the bits higher than the conversion target bit are equal to a value based on the comparison result. In this way, the data control section 18 can cause the output section 32 to determine whether the value of the conversion target bit is equal to zero or one, based on the comparison result between the input signal and the comparison signal.

If the conversion target bit is the most significant bit, i.e. the N-th bit, for example, the data control section 18 outputs comparison data representing a central level (Vref/2) of the input signal range. For example, the data control section 18 outputs comparison data in which the conversion target bit, in this case the most significant bit, is equal to one, and all other bits are equal to zero.

The data control section 18 may output comparison data expressing the central level of a comparison range determined by a binary search, every time the conversion target bit moves down to a lower bit. For example, the data control section 18 outputs comparison data in which the bits higher than the conversion target bit have values determined according to the comparison result, the conversion target bit is equal to one, and the bits lower than the conversion target bit are equal to zero.

Figure 7:
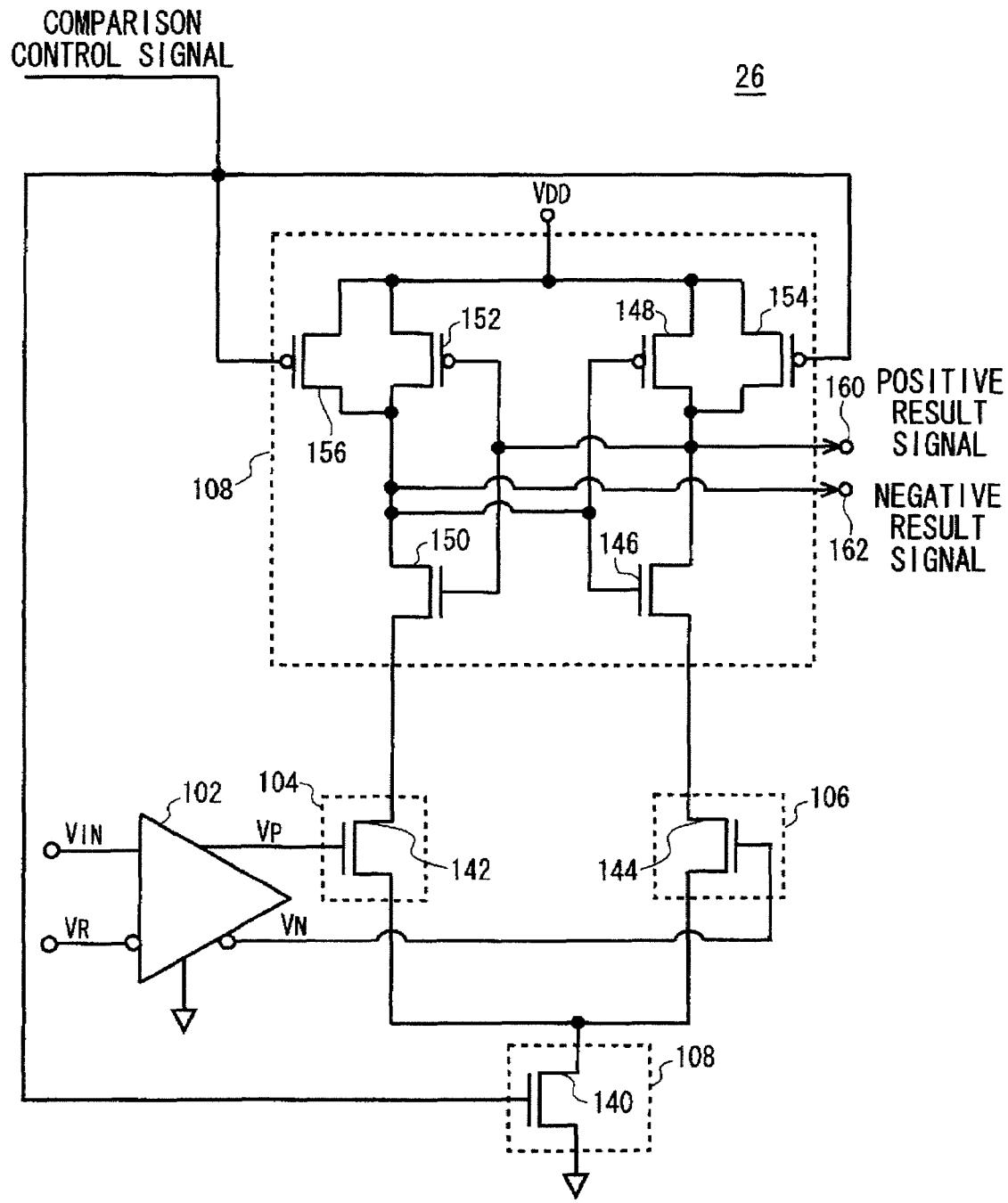
FIG. 7 shows an exemplary configuration of the comparing section 26 according to the present embodiment.

FIG. 7 shows an exemplary configuration of the comparing section 26 according to the present embodiment. The comparing section 26 is provided with a differential amplifier 102, a positive buffer 104, a negative buffer 106, and a latch core 108. The differential amplifier 102 receives two signals serving as the comparison targets, namely the input signal $V_{IN}$ and the comparison signal $V_R$. The differential amplifier 102 outputs, from the positive output terminal, a positive differential signal $V_P$ obtained by amplifying the difference between the input signal $V_{IN}$ and the comparison signal $V_R$. The differential amplifier 102 also outputs, from the negative output terminal, a negative differential signal $V_N$ having a level obtained by inverting the sign of the common voltage in relation to the positive differential signal $V_P$.

The positive buffer 104 receives the positive differential signal $V_P$ and converts the positive differential signal $V_P$ into the positive result signal indicating a logic level. The positive buffer 104 of the present embodiment includes an n-MOSFET 142. The gate of the n-MOSFET 142 inside the positive buffer 104 receives the positive differential signal $V_P$ output from the positive output terminal of the differential amplifier 102.

The negative buffer 106 receives the negative differential signal $V_N$ and converts the negative differential signal $V_N$ into the negative result signal indicating a logic level obtained by inverting the positive result signal. The negative buffer 106 of the present embodiment includes an n-MOSFET 144. The gate of the n-MOSFET 144 inside the negative buffer 106 receives the negative differential signal $V_N$ output from the negative output terminal of the differential amplifier 102.

The latch core 108 holds the logic level of the positive result signal and the logic level of the negative result signal during the comparison period. During the reset period, the latch core 108 resets the logic level of the positive result signal and the logic level of the negative result signal held therein to prescribed logic levels.

The latch core 108 of the present embodiment includes a reset n-MOSFET 140, a positive n-MOSFET 146, a positive p-MOSFET 148, a negative n-MOSFET 150, a negative p-MOSFET 152, a positive reset p-MOSFET 154, and a negative reset p-MOSFET 156. The gate of the reset n-MOSFET 140 receives the comparison control signal. The source of the reset n-MOSFET 140 is connected to a ground potential, which is logic L. The drain of the reset n-MOSFET 140 is connected to the source of the n-MOSFET 142 inside the positive buffer 104 and the source of the n-MOSFET 144 inside the negative buffer 106. This reset n-MOSFET 140 is turned on while the comparison control signal is logic H, which corresponds to the comparison period, and is turned off while the comparison control signal is logic L, which corresponds to the reset period.

The gate of the positive n-MOSFET 146 and the gate of the positive p-MOSFET 148 are connected to each other. The drain of the positive n-MOSFET 146 and the drain of the positive p-MOSFET 148 are connected to each other. The source of the positive n-MOSFET 146 is connected to the drain of the n-MOSFET 144 inside the negative buffer 106. The source of the positive p-MOSFET 148 is connected to a power supply potential, which is logic H. Since the gates and drains of the positive n-MOSFET 146 and the positive p-MOSFET 148 are connected to each other, one of the positive n-MOSFET 146 and the positive p-MOSFET 148 will be turned off when the other is turned on.

The gate of the negative n-MOSFET 150 and the gate of the negative p-MOSFET 152 are connected to each other. The drain of the negative n-MOSFET 150 and the drain of the negative p-MOSFET 152 are connected to each other. The source of the negative n-MOSFET 150 is connected to the drain of the n-MOSFET 142 inside the positive buffer 104. The source of the negative p-MOSFET 152 is connected to a power supply potential, which is logic H. Since the gates and drains of the negative n-MOSFET 150 and the negative p-MOSFET 152 are connected to each other, one of the negative n-MOSFET 150 and the negative p-MOSFET 152 will be turned off when the other is turned on.

The drains of the positive n-MOSFET 146 and the positive p-MOSFET 148 are connected to the positive output terminal 160. The drains of the negative n-MOSFET 150 and the negative p-MOSFET 152 are connected to the negative output terminal 162.

The gates of the positive n-MOSFET 146 and the positive p-MOSFET 148 are connected to the drains of the negative n-MOSFET 150 and the negative p-MOSFET 152. The gates of the negative n-MOSFET 150 and the negative p-MOSFET 152 are connected to the drains of the positive n-MOSFET 146 and the positive p-MOSFET 148.

Accordingly, when the positive n-MOSFET 146 is turned on and the positive p-MOSFET 148 is turned off, the negative n-MOSFET 150 is turned off and the negative p-MOSFET 152 is turned on. On the other hand, when the positive n-MOSFET 146 is turned off and the positive p-MOSFET 148 is turned on, the negative n-MOSFET 150 is turned on and the negative p-MOSFET 152 is turned off. Therefore, the negative output terminal 162 and the positive output terminal 160 operate as inverted switches. In other words, the negative output terminal 162 is the ground potential (logic L) when the positive output terminal 160 is the power supply potential (logic H) and the negative output terminal 162 is the ground potential (logic L) when the positive output terminal 160 is the power supply potential (logic H).

The gate of the positive reset p-MOSFET 154 receives the comparison control signal. The drain of the positive reset p-MOSFET 154 is connected to the positive output terminal 160. The source of the positive reset p-MOSFET 154 is connected to the power supply potential (logic H). This positive reset p-MOSFET 154 is turned off while the comparison control signal is logic H, which corresponds to the comparison period, and turned on while the comparison control signal is logic L, which corresponds to the reset period.

The gate of the negative reset p-MOSFET 156 receives the comparison control signal. The drain of the negative reset p-MOSFET 156 is connected to the negative output terminal 162. The source of the negative reset p-MOSFET 156 is connected to the power supply potential (logic H). This negative reset p-MOSFET 156 is turned off while the comparison control signal is logic H, which corresponds to the comparison period, and turned on while the comparison control signal is logic L, which corresponds to the reset period.

In the comparing section 26 having the above structure, the reset n-MOSFET 140 is turned off and the positive reset p-MOSFET 154 and the negative reset p-MOSFET 156 are turned on during the reset period. Therefore, during the reset period, the comparing section 26 can output the prescribed logic level (logic H) from the negative output terminal 162 and the positive output terminal 160.

In the comparing section 26 having the above structure, the reset n-MOSFET 140 is turned on and the positive reset p-MOSFET 154 and the negative reset p-MOSFET 156 are turned off during the comparison period. Accordingly, when the positive differential signal $V_P$ is greater than the negative differential signal $V_N$ at a timing when the comparison period begins, the potential of the drain of the n-MOSFET 142 inside the positive buffer 104 is decreased and the potential of the drain of the n-MOSFET 144 inside the negative buffer 106 is increased. Therefore, the positive n-MOSFET 146 is turned off, the positive p-MOSFET 148 is turned on, the negative n-MOSFET 150 is turned on, and the negative p-MOSFET 152 is turned off. As a result, the positive output terminal 160 is logic H and the negative output terminal 162 is logic L.

When the positive differential signal $V_P$ is less than the negative differential signal $V_N$ at a timing when the comparison period begins, the potential of the drain of the n-MOSFET 142 inside the positive buffer 104 is increased and the potential of the drain of the n-MOSFET 144 inside the negative buffer 106 is lowered. Therefore, the positive n-MOSFET 146 is turned on, the positive p-MOSFET 148 is turned off, the negative n-MOSFET 150 is turned off, and the negative p-MOSFET 152 is turned on. As a result, the positive output terminal 160 is logic L and the negative output terminal 162 is logic H.

In this way, the comparing section 26 can output the negative result signal and the positive result signal representing the comparison result with differential values, during the comparison period. Furthermore, the comparing section 26 can output the negative result signal and the positive result signal representing logic values fixed at one value, such as logic H, during the reset period.

Figure 8:
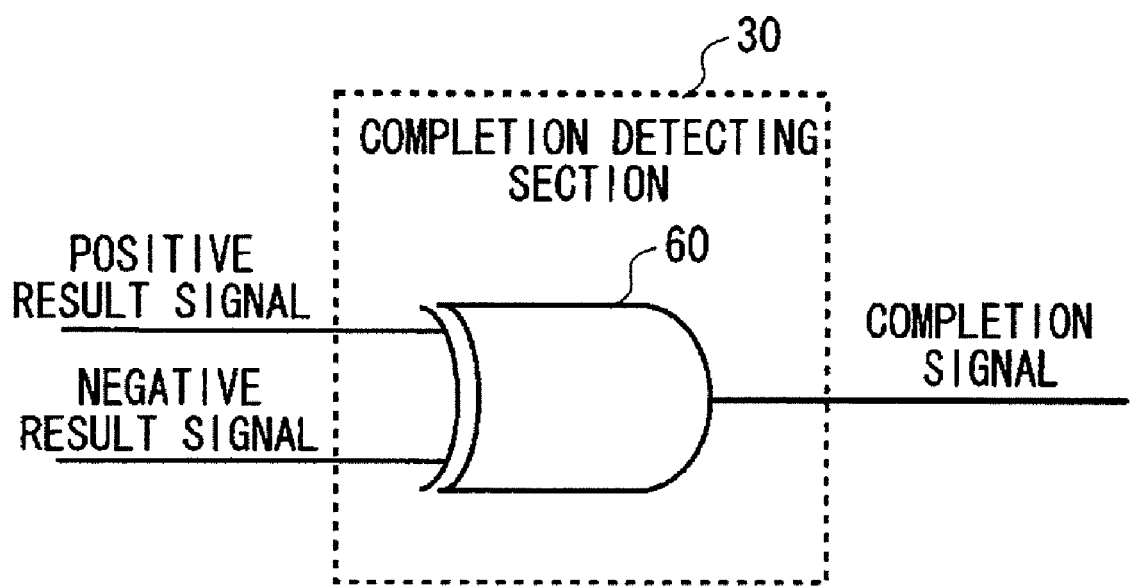
FIG. 8 shows an exemplary configuration of the completion detecting section 30 according to the present embodiment.

FIG. 8 shows an exemplary configuration of the completion detecting section 30 according to the present embodiment. The completion detecting section 30 may include an EXOR circuit 60. The EXOR circuit 60 outputs a signal that is a first logic value, such as logic H, when the logic value of the positive result signal is not equal to the logic value of the negative result signal, and that is a second logic value, such as logic L, when the logic value of the positive result signal is equal to the logic value of the negative result signal. In this way, the completion detecting section 30 can output the completion signal at the timing at which the logic value of the positive result signal is not equal to the logic value of the negative result signal.

Instead of the EXOR circuit 60, the completion detecting section 30 may include (i) a differential amplifier that outputs an amplified signal obtained by amplifying the difference between the positive result signal and the negative result signal and (ii) a comparator that outputs the completion signal at a timing at which the absolute value of the amplified signal is greater than a predetermined value. The EXOR circuit 60 having this configuration can also output the completion signal prior to the comparing section 26 being reset.

Figure 9:
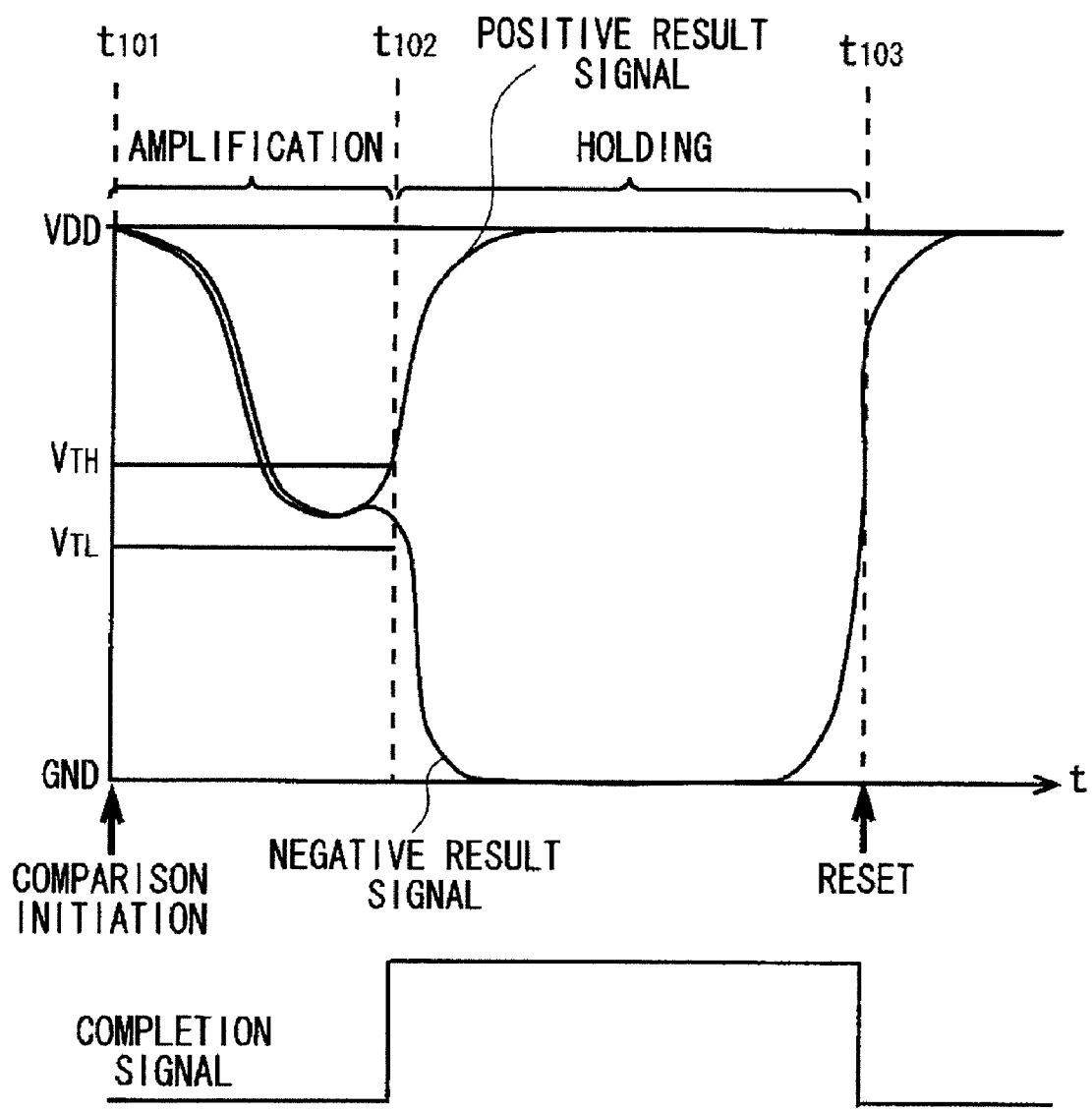
FIG. 9 shows examples of the positive result signal and the negative result signal output by the comparing section 26 shown in FIG. 7, and an example of the completion signal output by the completion detecting section 30 shown in FIG. 8.

FIG. 9 shows examples of the positive result signal and the negative result signal output by the comparing section 26 shown in FIG. 7, and an example of the completion signal output by the completion detecting section 30 shown in FIG. 8. Upon receiving the comparison initiation order (time t101), the differential amplifier 102 in the comparing section 26 differentially amplifies the difference between the input signal and the comparison signal (times t101 to t102). After the prescribed delay time has passed since receiving the comparison initiation order (time t102), the positive buffer 104 and he negative buffer 106 in the comparing section 26 set the positive result signal to be logic H, or logic L, and set the negative result signal to be a logic value opposite that of the positive result signal. The latch core 108 holds the logic values of the positive result signal and the negative result signal until the reset order is received (times t102 to t103).

The EXOR circuit 60 in the completion detecting section 30 changes the completion signal from logic L to logic H at a timing at which the logic value of the positive result signal is not equal to the logic value of the negative result signal (time t102). In this way, the completion detecting section 30 can output the completion signal prior to the comparing section 26 being reset.

Figure 10:
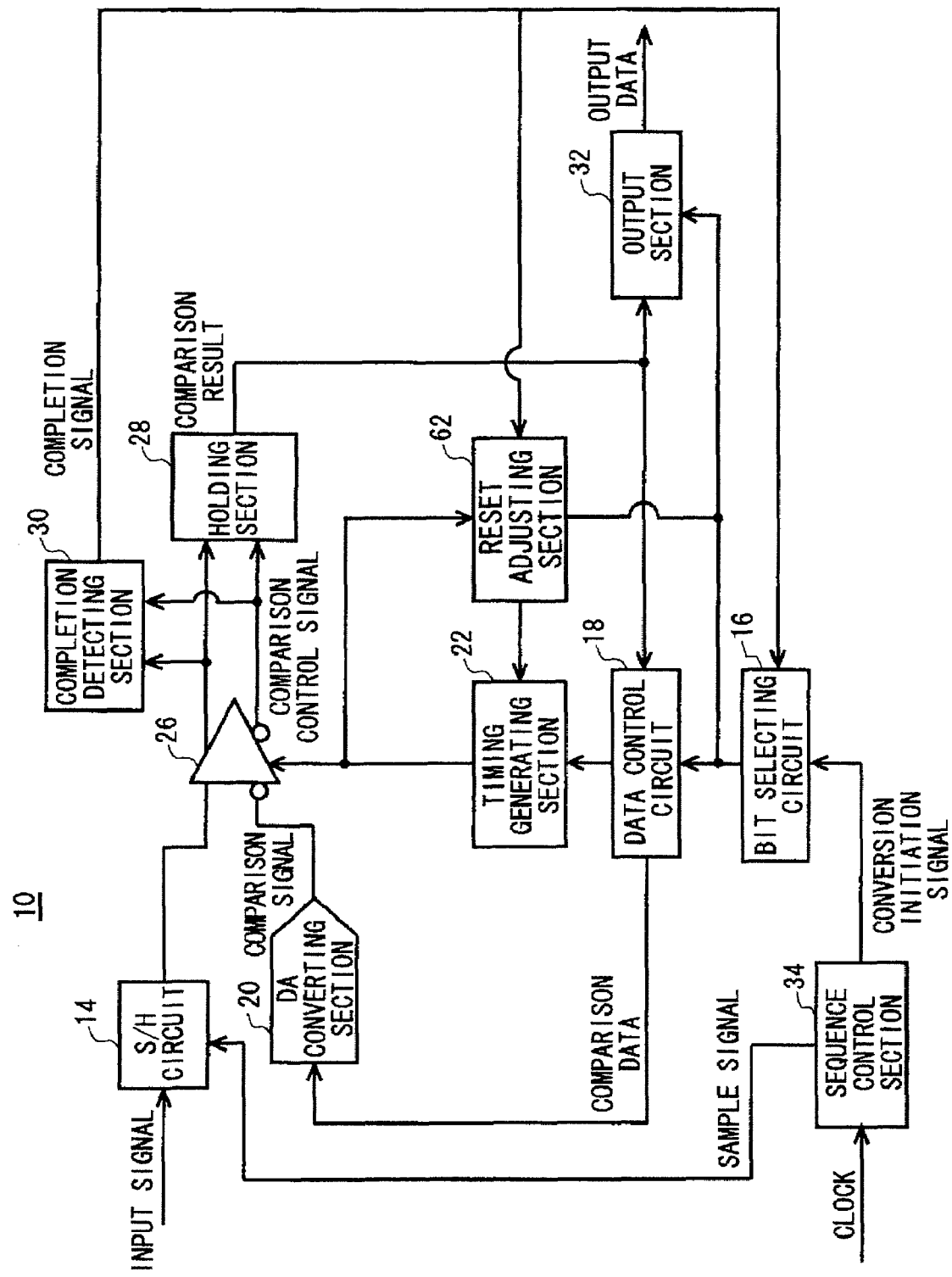
FIG. 10 shows a configuration of the AD conversion apparatus 10 according to a first modification of the present embodiment.

FIG. 10 shows a configuration of the AD conversion apparatus 10 according to a first modification of the present embodiment. The AD conversion apparatus 10 of the present modification adopts substantially the same function and configuration as the AD conversion apparatus 10 shown in FIG. 1, and therefore components of the AD conversion apparatus 10 of the present modification having the same function and configuration as components of the AD conversion apparatus 10 of FIG. 1 are given the same reference numerals, and the following description includes differing points only.

The AD conversion apparatus 10 of the present modification is further provided with a reset adjusting section 62. The reset adjusting section 62 changes the timing of the reset shown by the comparison control signal at the next conversion target bit, according to the response time, which is from when the comparing section 26 begins the comparison to when the comparing section 26 outputs the comparison result between the input signal and the comparison signal. Since the AD conversion apparatus 10 of the present modification can change the comparison time, which is from when the comparing section 26 begins the comparison process to when the comparing section 26 is reset, the AD conversion apparatus 10 can control the power consumed by the comparing section 26.

Figure 11:
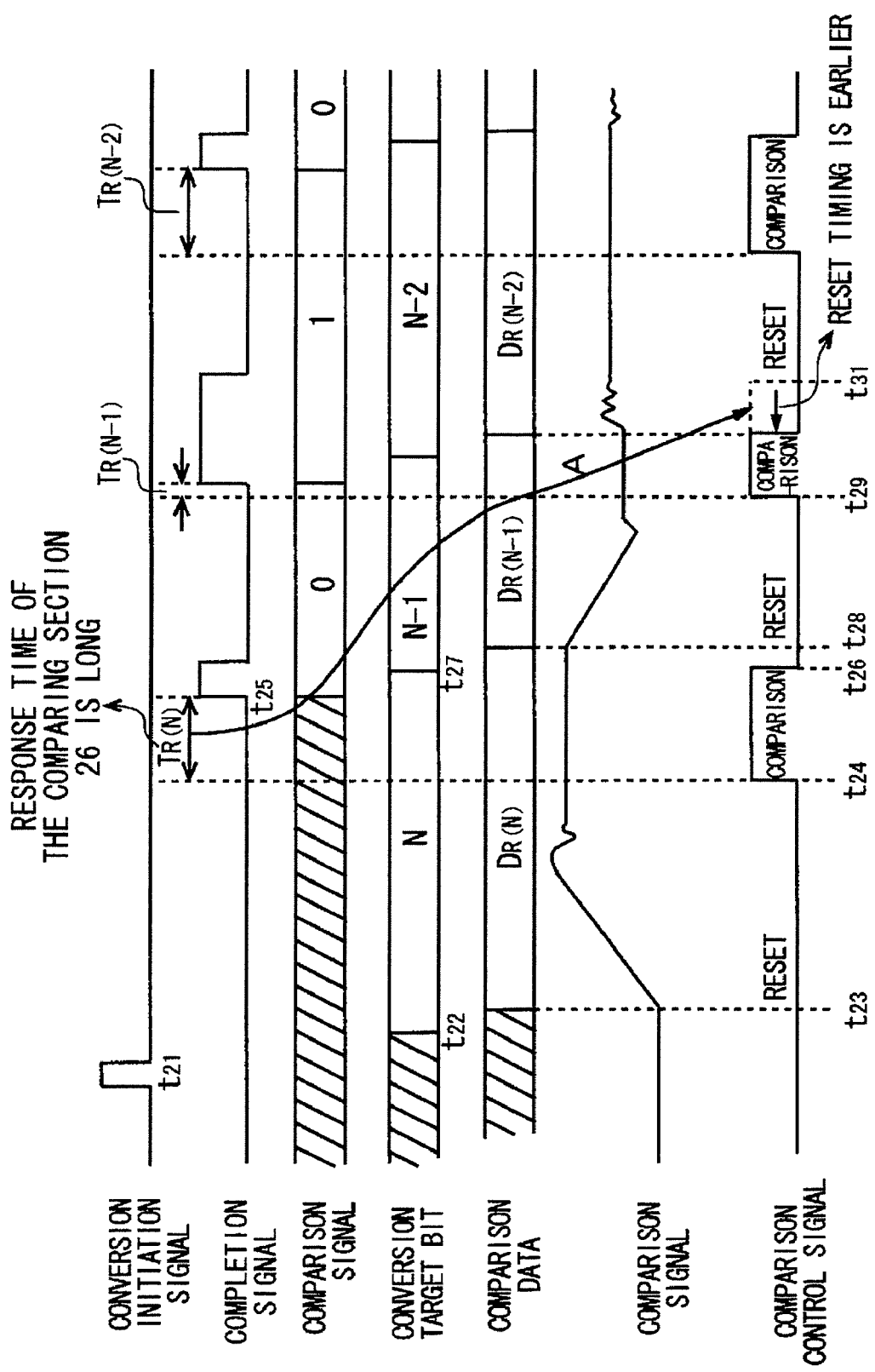
FIG. 11 is an exemplary timing chart of the signals in the AD conversion apparatus 10 according to the first modification shown in FIG. 10.

FIG. 11 is an exemplary timing chart of the signals in the AD conversion apparatus 10 according to the first modification shown in FIG. 10. The response time, from when the comparing section 26 receives the comparison initiation order to when the comparing section 26 outputs the comparison result, increases as the difference between the input signal and the comparison signal supplied to the comparing section 26 becomes smaller. Accordingly, the timing generating section 22 controls the comparison control signal such that the period from when the comparing section 26 begins the comparison operation to when the comparing section 26 is reset, namely the comparison period, becomes relatively long in comparison to the slowest response time of the comparing section 26. In this way, the timing generating section 22 can prevent the comparing section 26 from being reset before the comparing section 26 outputs the comparison result.

The comparison signal output from the DA converting section 20 changes according to a binary search. In other words, every time the conversion target bit moves one bit lower, the comparison signal changes from the immediately prior level by a level that is ¼, ⅛, 1/16, 1/32, 1/64, . . . of the input signal range. Accordingly, when there is a very small difference between the input signal and the comparison signal at a certain bit when the conversion target bit moves down by one bit, the difference between the input signal and the comparison signal at the bit following the certain bit is substantially equal to the amount of change of the comparison signal. In other words, when there is a very small difference between the input signal and the comparison signal at a certain bit, the difference between the input signal and the comparison signal at the subsequent bit is relatively large.

Therefore, when the response time of the comparing section 26 is long at a certain bit, the response time of the comparing section 26 is relatively short at the subsequent bit. A long response time may refer to the response time of the comparing section 26 being greater than a threshold value. As shown by "A" and t31 in FIG. 11, when there is a long response time $T_R$, which is from when the comparing section 26 begins the comparison to when the comparing section 26 outputs the comparison result between the input signal and the comparison signal, the reset adjusting section 62 may cause the timing of the reset indicated by the comparison control signal at the subsequent conversion target bit to be earlier. In this way, the reset adjusting section 62 can shorten the comparison time of the comparing section 26, which is from when the comparing section 26 begins the comparison process to when the comparing section 26 is reset, so as to decrease the power consumed by the comparing section 26.

During the binary search, the amount of change in the comparison signal output from the DA converting section 20 is smaller for bits lower than the conversion target bit. Accordingly, even if the response time of the comparing section 26 is long, the reset adjusting section 62 cannot cause the timing of the reset to be much earlier if the conversion target bit is a relatively lower bit. To solve this problem, the reset adjusting section 62 may cause the reset timing indicated by the comparison control signal at a subsequent conversion target bit to be earlier when the response time is long, on the condition that the conversion target bit be higher than a predetermined bit position. In this way, the reset adjusting section 62 can efficiently decrease the power consumed by the comparing section 26.

Figure 12:
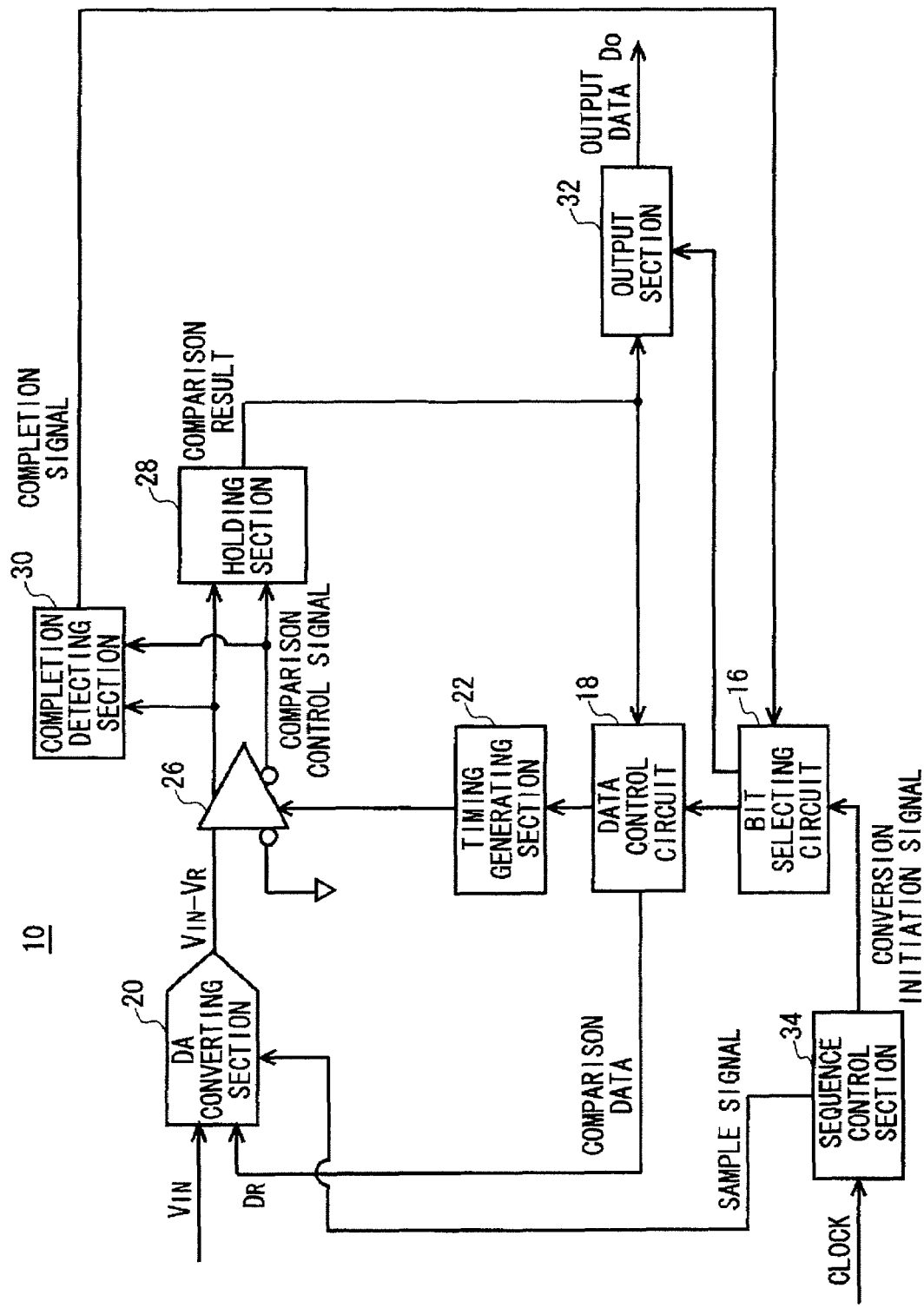
FIG. 12 shows a configuration of the DA converting section 20 according to a second modification of the present embodiment, along with the comparing section 26.

FIG. 12 shows a configuration of the DA converting section 20 according to a second modification of the present embodiment, along with the comparing section 26. The AD conversion apparatus 10 of the present modification adopts substantially the same function and configuration as the AD conversion apparatus 10 shown in FIG. 1, and therefore components of the AD conversion apparatus 10 of the present modification having the same function and configuration as components of the AD conversion apparatus 10 of FIG. 1 are given the same reference numerals, and the following description includes differing points only.

The DA converting section 20 of the present modification may be a charge-redistribution DA converter that has the function of the S/H circuit 14, as in, for example, US Patent Application Publication No. US2007/0,132,626. During sampling, the charge-redistribution DA converting section 20 samples the voltage of the input signal, which is the input voltage $V_{IN}$. The DA converting section 20 holds the sampled input voltage $V_{IN}$ during the holding period. Also during the holding period, the DA converting section 20 outputs, from the output end, a voltage obtained by subtracting the sampled input voltage $V_{IN}$ from the comparison voltage $V_R$ corresponding to the supplied comparison data $D_R$.

The comparing section 26 of the present modification compares a common voltage to the output voltage from the output end of the DA converting section 20, and outputs the comparison result. In this way, the comparing section 26 can output the comparison result between the input voltage $V_{IN}$ and the comparison voltage $V_R$.

The AD conversion apparatus 10 according to the present embodiment can perform AD conversion with a relatively small amount of power. The AD conversion apparatus 10 of the present embodiment may further include the S/H circuit 14 at a stage before the DA converting section 20.

Figure 13:
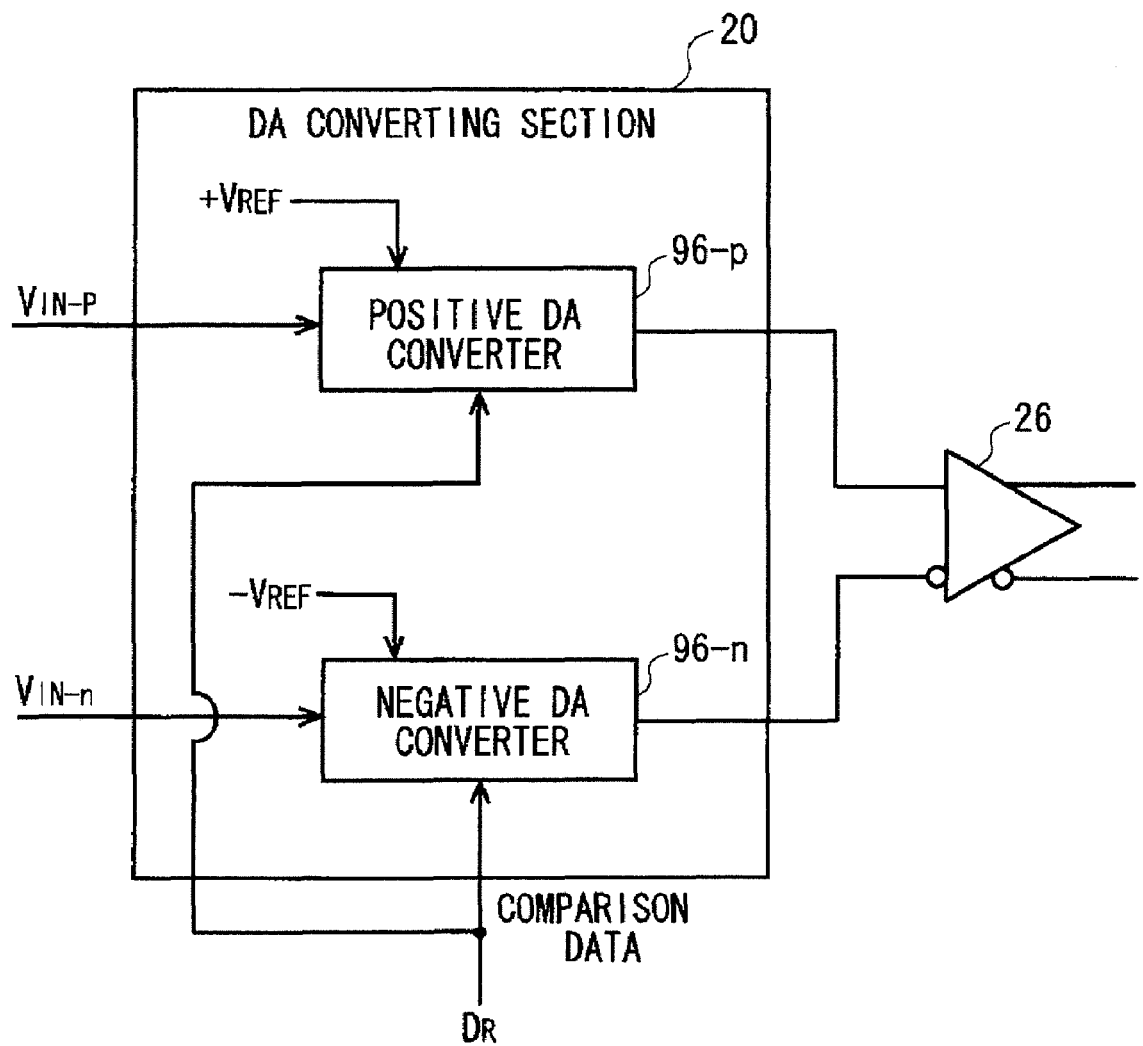
FIG. 13 shows a configuration of the DA converting section 20 according to a third modification of the present embodiment, along with the comparing section 26.

FIG. 13 shows a configuration of the DA converting section 20 according to a third modification of the present embodiment, along with the comparing section 26. The AD conversion apparatus 10 of the present modification adopts substantially the same function and configuration as the AD conversion apparatus 10 shown in FIG. 1, and therefore components of the AD conversion apparatus 10 of the present modification having the same function and configuration as components of the AD conversion apparatus 10 of FIG. 1 are given the same reference numerals, and the following description includes differing points only.

The AD conversion apparatus 10 of the present modification outputs digital data corresponding to a differential analog input voltage ($V_{IN-p}$, $V_{IN-n}$). The DA converting section 20 of the present modification includes a positive DA converter 96-$p$ and a negative DA converter 96-$n$.

The positive DA converter 96-$p$ is a charge-redistribution type that samples the positive input voltage $V_{IN-p}$ during sampling and holds the sampled positive input voltage $V_{IN-p}$ during the holding period. The positive DA converter 96-$p$ is provided with a positive reference voltage +$V_{REF}$ as the reference voltage during the holding period. As a result of being supplied with the comparison data $D_R$ during the holding period, the positive DA converter 96-$p$ outputs a voltage $V_{IN-p}$-$V_{R-p}$ obtained by subtracting the positive comparison voltage $V_{R-p}$ corresponding to the comparison data $D_R$ from the positive input voltage $V_{IN-p}$.

The negative DA converter 96-$n$ is a charge-redistribution type that samples the negative input voltage $V_{IN-n}$ during sampling and holds the sampled negative input voltage $V_{IN-n}$ during the holding period. The negative DA converter 96-$n$ is provided with a negative reference voltage -$V_{REF}$, which is obtained by inverting the sign of the positive reference voltage +$V_{REF}$, as the reference voltage during the holding period. As a result of being supplied with the comparison data $D_R$ during the holding period, the negative DA converter 96-$n$ outputs a voltage $V_{IN-n}$-$V_{R-n}$ obtained by subtracting the negative comparison voltage $V_{R-n}$ corresponding to the comparison data $D_R$ from the negative input voltage $V_{IN-n}$.

The comparing section 26 of the present modification outputs a comparison result obtained by comparing (i) the differential voltage between the positive input voltage $V_{IN-p}$ and the negative input voltage $V_{IN-n}$ and (ii) the differential voltage between the positive comparison voltage $V_{R-p}$ and the negative comparison voltage $V_{R-n}$. In this way, the comparing section 26 can output a comparison result between the differential input voltage $V_{IN}$ and the differential comparison voltage $V_R$.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A successive approximation AD conversion apparatus that outputs digital output data corresponding to an analog input signal, comprising:
    a bit selecting section that selects a conversion target bit sequentially from a highest bit of the output data;
    a data control section that outputs comparison data determining a value of the conversion target bit, each time a conversion target bit is selected;
    a DA converting section that outputs an analog comparison signal corresponding to the comparison data;
    a comparing section that outputs a comparison result between the input signal and the comparison signal, upon the output of the comparison signal by the DA converting section, and that is reset after outputting the comparison result;
    a completion detecting section that, upon detecting that the comparing section has output the comparison result, outputs a completion signal causing the bit selecting section to select a next conversion target bit, prior to the comparing section being reset; and
    an output section that outputs output data in which a value of each bit is based on the comparison result by the comparing section.

2. A successive approximation AD conversion apparatus that outputs digital output data corresponding to an analog input signal, comprising:
    a bit selecting section that selects a conversion target bit sequentially from a highest bit of the output data;
    a data control section that outputs comparison data determining a value of the conversion target bit, each time a conversion target bit is selected;
    a DA converting section that outputs an analog comparison signal corresponding to the comparison data;
    a comparing section that outputs a comparison result between the input signal and the comparison signal, upon the output of the comparison signal by the DA converting section, and that is reset after outputting the comparison result;
    a completion detecting section that, upon detecting that the comparing section has output the comparison result, outputs a completion signal causing the bit selecting section to select a next conversion target bit, prior to the comparing section being reset; and
    an output section that outputs output data in which a value of each bit is based on the comparison result by the comparing section, wherein
    the data control section outputs the comparison data indicating a boundary between (i) output data in which the conversion target bit is equal to zero and bits higher than the conversion target bit have values based on the comparison result and (ii) output data in which the conversion target bit is equal to one and the bits higher than the conversion target bit have values based on the comparison result.

3. The AD conversion apparatus according to claim 2, further comprising
    a timing generating section that generates a comparison control signal ordering comparison initiation, after a prescribed delay time has passed since the comparison data was supplied to the DA converting section, wherein the comparing section begins comparing the input signal to the comparison signal at the comparison initiation timing indicated by the comparison control signal.

4. The AD conversion apparatus according to claim 3, wherein
the timing generating section outputs the comparison control signal ordering the reset, after a prescribed delay time has passed since the comparison initiation was ordered,
the comparing section resets the comparison result at the reset timing indicated by the comparison control signal, outputs a positive result signal and a negative result signal representing the comparison result as differential logic values during a comparison period, and outputs a positive result signal and a negative result signal representing logic values fixed at one value during a reset period; and
the completion detecting section outputs the completion signal at a timing when the logic value of the positive result signal is not equal to the logic value of the negative result signal.

5. The AD conversion apparatus according to claim 3, wherein
the timing generating section outputs the comparison control signal indicating the reset, after a prescribed delay time has passed since the comparison initiation,
the comparing section resets the comparison result at the reset timing indicated by the comparison control signal, outputs a positive result signal and a negative result signal representing the comparison result as differential logic values during a comparison period, and outputs a positive result signal and a negative result signal representing logic values fixed at one value during a reset period; and
the completion detecting section includes:
  a differential amplifier that outputs an amplified signal obtained by amplifying a difference between the positive result signal and the negative result signal; and
  a comparator that outputs the completion signal at a timing when the absolute value of the amplified signal is greater than a predetermined value.

6. The AD conversion apparatus according to claim 3, wherein
the timing generating section outputs the comparison control signal indicating the reset, after a prescribed delay time has passed since the comparison initiation, and
the comparing section resets the comparison result at the reset timing indicated by the comparison control signal, the AD conversion apparatus further comprising:
a reset adjusting section that changes the timing of the reset indicated by the comparison control signal for a next conversion target bit, according to a response time, which is from when the comparing section begins the comparison to when the completion detecting section outputs the completion signal.

7. The AD conversion apparatus according to claim 6, wherein
the reset adjusting section causes the reset timing indicated by the comparison control signal of the next conversion target bit to be earlier when the response time is longer.

8. The AD conversion apparatus according to claim 7, wherein
the reset adjusting section causes the reset timing indicated by the comparison control signal of the next conversion target bit to be earlier when the response time is longer, on a condition that the conversion target bit be higher than a predetermined bit position.

9. A successive approximation AD conversion apparatus that outputs digital output data corresponding to an analog input signal, comprising:
  a bit selecting section that selects a conversion target bit sequentially from a highest bit of the output data;
  a data control section that outputs comparison data determining a value of the conversion target bit, each time a conversion target bit is selected;
  a DA converting section that outputs an analog comparison signal corresponding to the comparison data;
  a comparing section that outputs a comparison result between the input signal and the comparison signal, upon the output of the comparison signal by the DA converting section, and that is reset after outputting the comparison results;
  a completion detecting section that, upon detecting that the comparing section has output the comparison result, outputs a completion signal causing the bit selecting section to select a next conversion target bit, prior to the comparing section being reset; and
  an output section that outputs output data in which a value of each bit is based on the comparison result by the comparing section, wherein
  the DA converting section is a capacitor array DA converter.

* * * * *